United States Patent
Ogawa (10) Patent No.: US 12,038,680 B2
(45) Date of Patent: Jul. 16, 2024

(54) IMAGE PROJECTION DEVICE

(71) Applicant: SONY GROUP CORPORATION, Tokyo (JP)

(72) Inventor: Yusuke Ogawa, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 379 days.

(21) Appl. No.: 17/309,342

(22) PCT Filed: Nov. 14, 2019

(86) PCT No.: PCT/JP2019/044729
§ 371 (c)(1),
(2) Date: May 20, 2021

(87) PCT Pub. No.: WO2020/110757
PCT Pub. Date: Jun. 4, 2020

(65) Prior Publication Data
US 2022/0011660 A1   Jan. 13, 2022

(30) Foreign Application Priority Data
Nov. 29, 2018   (JP) ................. 2018-223778

(51) Int. Cl.
*G03B 21/28* (2006.01)
*G02B 26/10* (2006.01)
(Continued)

(52) U.S. Cl.
CPC .......... *G03B 21/28* (2013.01); *G02B 26/105* (2013.01); *G03B 21/008* (2013.01); *B81B 3/0018* (2013.01); *B81B 2201/045* (2013.01)

(58) Field of Classification Search
CPC .. G03B 21/28; G03B 21/008; G03B 21/2033; G02B 26/105; G02B 26/101;
(Continued)

(56) References Cited

U.S. PATENT DOCUMENTS 5,802,222 A * 9/1998 Rasch ............... G02B 26/0808
385/9
2003/0189742 A1* 10/2003 Kobayashi ............. G03B 33/06
348/E9.026
(Continued)

FOREIGN PATENT DOCUMENTS

| CN | 101512431 A | 8/2009 |
|---|---|---|
| CN | 102540670 A | 7/2012 |

(Continued)

OTHER PUBLICATIONS

International Search Report and Written Opinion of PCT Application No. PCT/JP2019/044729, issued on Jan. 28, 2020, 09 pages of ISRWO.

*Primary Examiner* — Magda Cruz
(74) *Attorney, Agent, or Firm* — CHIP LAW GROUP (57) ABSTRACT

Provided is a technology for improving the resolution and the angle of view of an image projection device. The image projection device includes an optical waveguide element including at least one incident port on which a laser beam is incident and a plurality of emission ports from which the laser beam is emitted, and a scanning mirror that performs scanning with the laser beam emitted from the optical waveguide element, in which the laser beam with which the scanning mirror performs the scanning reaches a projection target. The image projection device further includes a hologram element that condenses the laser beam with which the scanning mirror performs the scanning on a vicinity of a pupil to allow the laser beam to reach a retina.

10 Claims, 5 Drawing Sheets

(51) Int. Cl.
*G03B 21/00* (2006.01)
*B81B 3/00* (2006.01)

(58) Field of Classification Search
CPC .. G02B 27/0172; G02B 6/2935; G02B 26/10; B81B 2201/045; G02F 1/313
See application file for complete search history.

(56) References Cited

U.S. PATENT DOCUMENTS

| | | | |
|---|---|---|---|
| 2016/0094818 A1* | 3/2016 | Okamoto | H04N 9/317 348/196 |
| 2017/0200422 A1* | 7/2017 | Okamoto | G09G 3/02 |
| 2018/0306978 A1* | 10/2018 | Kagawa | G02B 6/12007 |
| 2020/0014892 A1* | 1/2020 | Wang | H04N 9/3135 |

FOREIGN PATENT DOCUMENTS

| | | | | |
|---|---|---|---|---|
| CN | 105467586 A | | 4/2016 | |
| CN | 105933685 A | | 9/2016 | |
| CN | 107561701 A | | 1/2018 | |
| CN | 110235046 A | | 9/2019 | |
| JP | 2003054035 A | | 2/2003 | |
| JP | 2005173562 A | | 6/2005 | |
| JP | 2006-108781 A | | 4/2006 | |
| JP | 2008-032895 A | | 2/2008 | |
| JP | 2015118359 A | * | 6/2015 | ............. G02B 27/48 |
| JP | 2016-071260 A | | 5/2016 | |
| JP | 2017-125905 A | | 7/2017 | |
| WO | 2016/203991 A | | 12/2016 | |

* cited by examiner

IMAGE PROJECTION DEVICE

CROSS REFERENCE TO RELATED APPLICATIONS

This application is a U.S. National Phase of International Patent Application No. PCT/JP2019/044729 filed on Nov. 14, 2019, which claims priority benefit of Japanese Patent Application No. JP 2018-223778 filed in the Japan Patent Office on Nov. 29, 2018. Each of the above-referenced applications is hereby incorporated herein by reference in its entirety.

TECHNICAL FIELD

The present technology relates to an image projection device. More specifically, the present technology relates to an image projection device including a scanning mirror.

BACKGROUND ART

In recent years, attention has been focused on a technology of superimposing an image on an outside scene. This technology is also called an augmented reality (AR) technology. An example of a device that provides the AR to a user is a retinal scanning type image projection device including a scanning mirror. The device may include, for example, a combination of a laser light source, the scanning mirror that performs scanning with a laser beam, and a hologram that condenses the light beam with which the scanning mirror performs the scanning on the vicinity of a pupil.

The scanning mirror is also used in a non-retinal scanning type image projection device. For example, in Patent Document 1 below discloses a projection device including a light source unit including a plurality of light sources that generates laser beams, and one scanning unit that projects, onto a screen, the plurality of laser beams generated from the plurality of light sources of the light source unit while the scanning unit reflects the plurality of laser beams and scans the screen with the plurality of laser beams, in which the plurality of light sources is provided in a shifted state so that the laser beams generated by the plurality of light sources have different scanning optical paths on the screen, and the laser beams shifted from each other are modulated by different image signals (claim 1).

CITATION LIST

Patent Document

Patent Document 1: WO 2016/203991 A

SUMMARY OF THE INVENTION

Problems to be Solved by the Invention

If the image projection device including the scanning mirror can have a higher resolution and/or a wider angle of view, a better image can be presented to the user. In order to increase the resolution of the image projection device, for example, it is conceivable to increase a resonance frequency of the scanning mirror, but this may reduce the reliability of the scanning mirror. Furthermore, in order to widen the angle of view of the image projection device, it is conceivable to increase a swing angle of the scanning mirror, but this may also reduce the reliability of the scanning mirror. As described above, the resolution and the angle of view of the image projection device are in a trade-off relationship with the reliability of the scanning mirror. Therefore, the improvement of the resolution and/or the angle of view of the image projection device is limited by the performance of the scanning mirror.

A main purpose of the present technology is to provide a new technology for improving the resolution and/or the angle of view of an image projection device including a scanning mirror.

Solutions to Problems

The present technology provides an image projection device including an optical waveguide element including at least one incident port on which a laser beam is incident and a plurality of emission ports from which the laser beam is emitted, and a scanning mirror that performs scanning with the laser beam emitted from the optical waveguide element, in which the laser beam with which the scanning mirror performs the scanning reaches a projection target.

The optical waveguide element may include a switching unit that switches an emission port from which the laser beam is emitted.

The optical waveguide element may include a switching unit that switches an emission port from which the laser beam is emitted, and the switching unit may include at least one optical switch.

The optical waveguide element may include a switching unit that switches an emission port from which the laser beam is emitted, and the switching unit may include at least one Mach-Zehnder type optical switch.

In the present technology, a scanning line of a laser beam emitted from at least one of the plurality of emission port may be shifted from a scanning line of a laser beam emitted from another emission port.

According to one preferred embodiment of the present technology, the plurality of emission ports may be arranged so that, between facing parts of a scanning line of a laser beam emitted from one emission port, a scanning line of a laser beam emitted from another emission port is arranged.

According to one preferred embodiment of the present technology, the one emission port and the another emission port may be arranged so that a line connecting the one emission port and the another emission port is perpendicular to a sweep direction of the scanning mirror.

According to another preferred embodiment of the present technology, the plurality of emission ports may be arranged so that a scanning range of a laser beam emitted from one emission port and a scanning range of a laser beam emitted from another emission port are shifted from each other.

In the present technology, an emission port from which the laser beam is emitted may be switched for every predetermined number of frames.

In the present technology, a collimator lens that collimates the emitted laser beam may be arranged on an optical path between the optical waveguide element and the scanning mirror.

According to one embodiment of the present technology, the image projection device may further include a hologram element that condenses the laser beam with which the scanning mirror performs the scanning on a vicinity of a pupil to allow the laser beam to reach a retina.

According to another embodiment of the present technology, the image projection device may allow the laser beam with which the scanning mirror performs the scanning to reach the projection surface without or through the projection optical system.

MODE FOR CARRYING OUT THE INVENTION

Hereinafter, a suitable mode for carrying out the present technology will be described. Note that embodiments described below show typical embodiments of the present technology, and the scope of the present technology is not limited to these embodiments. Note that the present technology will be described in the following order.

1. Embodiment of Present Technology (Image projection Device)

(1) Description of Embodiment of Present Technology
(2) First Example of Embodiment of Present Technology (Example of Image Projection Device)
(3) Second Example of Embodiment of Present Technology (Examples of Arrangement of Emission Ports and Examples of Scanning Lines)
(4) Third Example of Embodiment of Present Technology (Example of Image Projection Device)

1. Embodiment of Present Technology (Image Projection Device)

(1) Description of Embodiment of Present Technology

In order to configure a retinal scanning type image projection device (for example, an eyewear type device), for example, a combination of a laser light source, a scanning mirror that performs scanning with a laser beam, and a hologram that condenses the scanning light beam on a pupil can be considered. Using the hologram makes it possible to see the external real world without distortion in AR expression, and the appearance is as natural as that in a case of wearing ordinary glasses.

The resolution and the angle of view of the image projection device that adopts the combination are limited by the performance of the scanning mirror. That is, in order to increase the resolution, it is conceivable to increase a resonance frequency of the scanning mirror. Furthermore, in order to increase the angle of view, it is conceivable to increase a swing angle of the scanning mirror.

However, increasing the resonance frequency and increasing the swing angle are in a trade-off relationship with the reliability of the scanning mirror. Therefore, in order to ensure the reliability, the increase in the resonance frequency and swing angle is limited.

For example, Patent Document 1 above discloses that laser beams emitted from a plurality of laser light sources are projected so as not to overlap in order to increase the resolution or the angle of view beyond the performance of the scanning mirror. However, there are two problems in applying the technology disclosed in Patent Document 1 above to the retinal scanning type image projection device. The first problem is related to mounting the plurality of laser light sources with high accuracy (for example, an accuracy of <1 μm) and a narrow pitch (for example, an interval of about several μm). For example, mounting the plurality of laser light sources with high accuracy may be technically difficult. Furthermore, since one laser light source usually has a width of about several tens of μm, it may be difficult to mount the laser light sources at a narrow pitch. The other problem is related to an angle dependence of a diffraction angle of the hologram. For example, in a case where the plurality of laser light sources is used, wavelength variation of each laser light source causes the diffraction angle of the hologram to vary, which may make it difficult to project the plurality of laser beams at a target position.

An image projection device according to the present technology includes an optical waveguide element including at least one incident port on which a laser beam is incident and a plurality of emission ports from which the laser beam is emitted, and a scanning mirror that performs scanning with the laser beam emitted from the optical waveguide element, in which the laser beam with which the scanning mirror performs the scanning reaches a projection target. That is, the optical waveguide element included in the image projection device includes the plurality of emission ports, and the scanning mirror performs the scanning with laser beams emitted from the plurality of emission ports to allow the laser beams to reach the projection target.

According to the present technology, the position of a scanning line of a laser beam emitted from one of the plurality of emission ports can be shifted from the position of a scanning line of a laser beam emitted from another emission port. With this configuration, for example, between facing parts of one scanning line, another scanning line is arranged, so that it is possible to improve the resolution of a projected image. Furthermore, a scanning area of the one scanning line is shifted from a scanning area of the another scanning line, so that it is possible to improve the angle of view of the projected image. As described above, the image projection device of the present technology can improve the resolution and/or increase the angle of view beyond the limits of the resolution and the angle of view determined by the performance of the scanning mirror.

Furthermore, the arrangement of the plurality of emission ports provided in the optical waveguide element can be controlled with high accuracy. In the present technology, the plurality of emission ports may be provided on one surface of one optical waveguide element. The positions of the plurality of emission ports are fixed. The positions may be controlled with high accuracy. Therefore, the image projection device of the present technology can mount a plurality of light emitting points (emission ports) with high accuracy. With this configuration, the positions of the scanning lines drawn by the scanning mirror can also be controlled with high accuracy, which may result in more appropriate improvement of the resolution and/or increase in the angle of view.

Furthermore, the plurality of emission ports provided in the optical waveguide element can be arranged at a narrow pitch. Therefore, the image projection device of the present technology can mount the plurality of light emitting points at a narrow pitch. This configuration results in a higher resolution of the image projection device.

Furthermore, if the present technology is applied to the image projection device, a multi-beam image can be projected with high accuracy without being affected by the mounting accuracy of a light source or the wavelength dependence of a hologram. As a result, it is possible to achieve a higher resolution and/or a wider angle of view beyond the performance limit of the scanning mirror.

Furthermore, since the image projection device of the present technology generates a multi-beam from, for example, one laser light source, the number of laser light sources can be reduced, and the number of laser light sources may be, for example, one. Therefore, the image projection device of the present technology is robust against the influence of a light source shift or a wavelength shift due to a change in the environmental temperature.

The optical waveguide element includes at least one incident port on which the laser beam is incident and the plurality of emission ports from which the laser beam is emitted. The optical waveguide element may be configured so that the laser beam incident on the at least one incident port is emitted from any of the plurality of emission ports. Since the incident laser beam is emitted from any of the plurality of emission ports, it is possible to draw a plurality of scanning lines that is shifted from each other.

The number of the plurality of emission ports may be selected according to the required number of scanning lines of the laser beams. For example, the number of the plurality of emission ports is two to ten, preferably two to eight, more preferably two to six, and particularly preferably two to four.

Furthermore, in the present technology, an interval between the plurality of emission ports (for example, an interval between any two emission ports, out of the plurality of the emission ports, used for improving the resolution or increasing the angle of view) is, for example, 0.1 μm to 15 μm, preferably 0.3 μm to 10 μm, more preferably 0.5 μm to 10 μm, and even more preferably 1 μm to less than 10 μm. In the present technology, the plurality of emission ports provided in the optical waveguide element may be used as the plurality of light emitting points at such a narrow pitch. With this configuration, it is possible to emit the multi-beam at a narrow pitch, resulting in the increase in the resolution and/or the angle of view.

The number of the at least one incident port may be selected according to, for example, the number of laser light sources that form the laser beams incident on the optical waveguide element. The number of the at least one incident port is, for example, one to ten, preferably one to eight, more preferably one to six, and particularly preferably one to four, and may be particularly preferably one, two, or three.

The number of laser light sources included in the image projection device of the present technology is, for example, one to ten, preferably one to eight, more preferably one to six, and particularly preferably one to four, and may be particularly preferably one, two, or three. In the image projection device of the present technology, since the optical waveguide element is provided with the emission ports as the light emitting points at a plurality of different positions, the number of laser light sources may be one.

The image projection device of the present technology may be configured so that a scanning line of a laser beam emitted from at least one of the plurality of emission port is shifted from a scanning line of a laser beam emitted from another emission port. With this configuration, for example, the resolution of the image projected by the image projection device can be improved, or the angle of view of the image can be increased.

Preferably, the optical waveguide element includes a switching unit that switches an emission port from which the laser beam is emitted. For example, a timing at which the emission port is switched can be controlled by the switching unit. With this configuration, it is possible to improve the resolution and/or increase the angle of view more appropriately.

In the image projection device of the present technology, the at least one incident light and the plurality of emission ports may be connected via the switching unit.

The switching unit may include, for example, at least one optical switch, and, for example, may include at least one Mach-Zehnder type optical switch. The number of optical switches included in the switching unit may be set on the basis of, for example, the configurations of the at least one incident port, the plurality of emission ports, and a waveguide in the optical waveguide element.

For example, in a case where the optical waveguide element includes one incident port and two emission ports, the optical waveguide element may include one optical switch. The one optical switch may control from which of the two emission ports the laser beam is emitted. Furthermore, in a case where the optical waveguide element includes one incident port and three or four emission ports, the optical waveguide element may include two or three optical switches, respectively. Similarly, the two or three optical switches may control from which of the three or four emission ports the laser beam is emitted.

The switching unit may include, for example, one to nine, preferably one to seven, more preferably one to five, and particularly preferably one to three optical switches.

For example, one input optical waveguide and two branch waveguides may be connected to each optical switch. Each optical switch may allow a laser beam traveling from the one input optical waveguide to travel to either of the two branch waveguides.

According to one preferred embodiment of the present technology, the plurality of emission ports may be arranged so that, between facing parts of a scanning line of a laser beam emitted from one emission port, a scanning line of a laser beam emitted from another emission port is arranged. According to this embodiment, the resolution of the image can be improved.

In this embodiment, preferably, the one emission port and the another emission port are arranged so that a line connecting the one emission port and the another emission port is perpendicular to a sweep direction of the scanning mirror. This configuration makes it easy to arrange the scanning line of the laser beam emitted from the another emission port between the facing parts of the scanning line of the laser beam emitted from the one emission port.

For example, in a case where the optical waveguide element includes two emission ports, the two emission ports may be arranged so that, approximately in the center between facing parts of a scanning line of a laser beam emitted from one emission port, a scanning line of a laser beam emitted from another emission port is arranged. In this case, the switching of the emission port may be performed for every predetermined number of frames, for example, for every frame.

Furthermore, in a case where the optical waveguide element includes three emission ports, the three emission ports may be arranged so that a space between facing parts of a scanning line of a laser beam emitted from one emission port is divided into three equal parts by scanning lines of laser beams emitted from other two emission ports. Even in this case, the switching of the emission port may be performed for every predetermined number of frames, for example, for every frame. More specifically, for a certain frame, the laser beam may be emitted from a first emission port, for the next frame, the laser beam may be emitted from a second emission port, and, for the frame following the next frame, the laser beam may be emitted from a third emission port. Then, these three emissions may be repeated in this order.

As described above, in the present technology, the emission port from which the laser beam is emitted may be switched for every predetermined number of frames.

The projection target reached by the laser beam with which the scanning mirror performs the scanning may be, for example, a retina of an animal (particularly a human), or any projection surface other than the retina. In the case where the projection target is the retina, for example, a hologram element may be used for the projection on the retina. In the case where the projection target is any projection surface, the projection surface includes, but is not limited to, a wall, a desk, a screen, and the like, for example. In this case, the image projection device is used in such a manner that a user recognizes an image displayed on the projection surface.

According to one embodiment of the present technology, the image projection device may further include a hologram element that condenses the laser beam with which the scanning mirror performs the scanning on a vicinity of a pupil to allow the laser beam to reach a retina. Condensing the laser beam on the vicinity of the pupil makes it possible to present an image with so-called Maxwellian view.

In the present technology, the scanning laser beam may be condensed, for example, on the pupil or shifted from the pupil by about several mm to ten-odd mm (for example, 1 mm to 20 mm, particularly 2 mm to 15 mm) in an optical axis direction. As in the latter case, the Maxwellian view can be achieved even if the focus is not on the pupil. Shifting the focus in the optical axis direction makes it possible to prevent the user from losing the image even if the image is shifted. More specifically, the diffracted light beam may be condensed on the pupil, in an intraocular lens, or between a corneal surface and the pupil.

According to another embodiment of the present technology, the image projection device may allow the laser beam with which the scanning mirror performs the scanning to reach the projection surface without or through the projection optical system. That is, the image projection device may be configured as a projector that projects an image on any projection surface. The projector may be configured as, for example, a small projector (also called a pico projector).

(2) First Example of Embodiment of Present Technology (Example of Image Projection Device)

According to one embodiment of the present technology, the image projection device may further include the hologram element that condenses the laser beam with which the scanning mirror performs the scanning on the vicinity of the pupil to allow the laser beam to reach the retina. The hologram element enables retina direct drawing image projection. The retina direct drawing image projection is also called an image projection with Maxwellian view.

An example of an image projection device according to this embodiment will be described below with reference to FIGS. 1A and 1B.

Figure 1A:
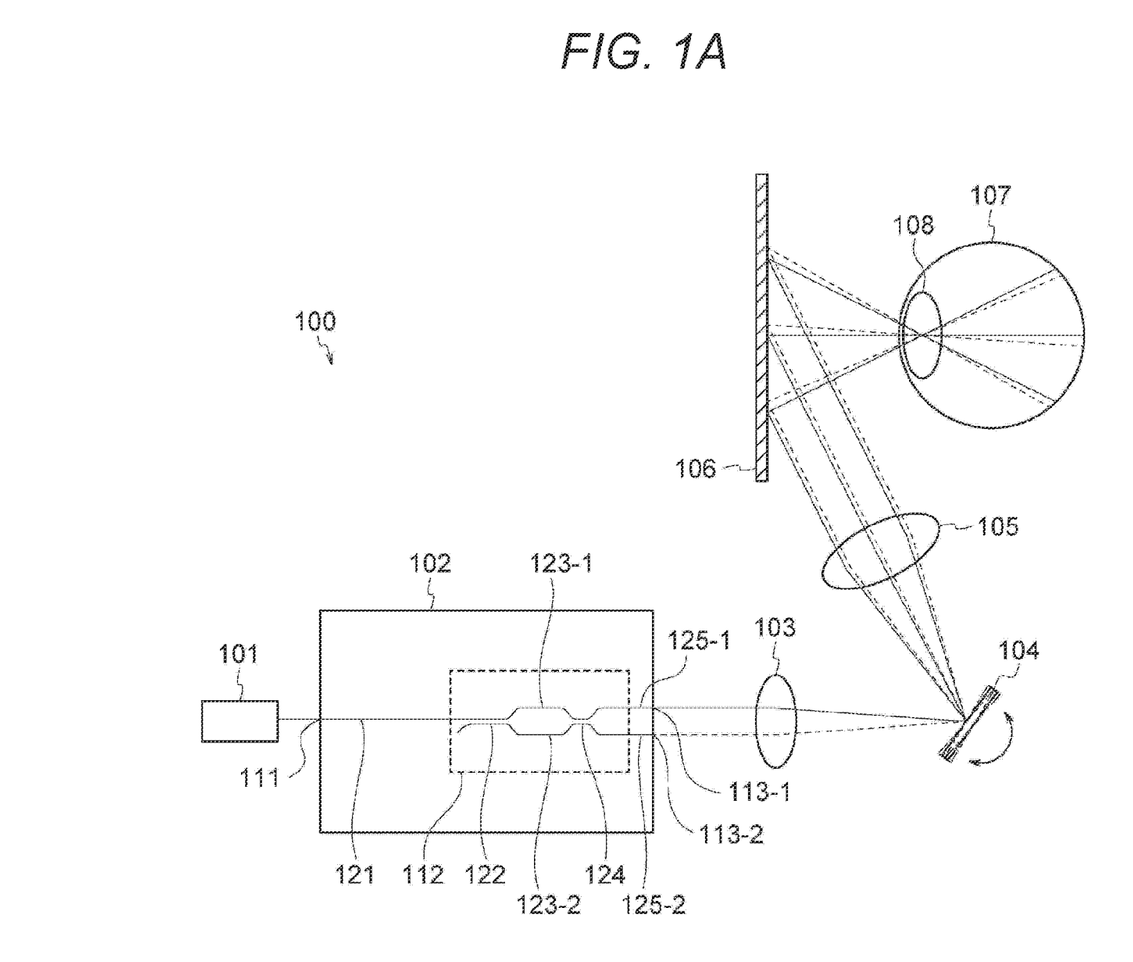
FIG. 1A is a schematic diagram of a configuration example of an image projection device according to the present technology.

FIG. 1A illustrates a configuration example of an image projection device 100 according to the present technology. The image projection device 100 includes a laser light source 101, an optical waveguide element 102, a collimator lens 103, a scanning mirror 104, a relay lens 105, and a hologram element 106.

Figure 1B:
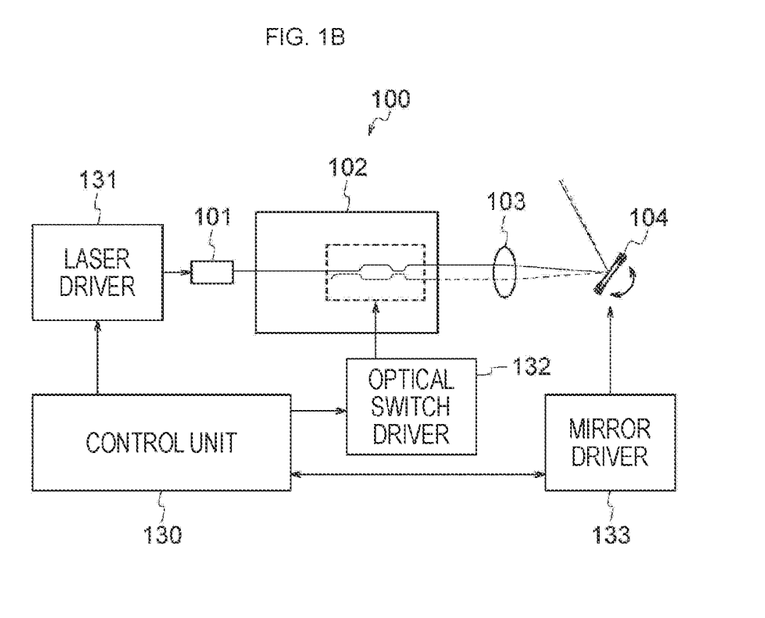
FIG. 1B is a block diagram for describing control of the image projection device according to the present technology.

FIG. 1B is an example of a block diagram of components for driving and controlling each component of the image projection device 100. The image projection device 100 further includes a control unit 130, a laser driver 131, an optical switch driver 132, and a mirror driver 133.

The laser light source 101 outputs a laser beam toward the optical waveguide element 102. The laser beam may be output as a single light flux including, for example, red, green, and blue laser beams. The colors of the laser beams constituting the light flux may be appropriately selected by those skilled in the art according to a desired image, are not limited to the above three colors, and may be, for example, two or one of the above three colors.

The laser light source 101 may be driven by the laser driver 131 illustrated in FIG. 1B. The laser driver 131 may modulate the output of the laser light source 101, for example, on the basis of an externally input image signal.

The laser beam emitted from the laser light source 101 is incident on the optical waveguide element 102 from an incident port 111 of the optical waveguide element 102.

The optical waveguide element 102 includes one incident port 111 on which the laser beam is incident, and two emission ports 113-1 and 113-2 from which the laser beam is emitted. As described above, the image projection device of the present technology includes the optical waveguide element including the plurality of emission ports from which the laser beam incident from the incident port is emitted. The plurality of emission ports from which the laser beam is emitted makes it possible to draw a plurality of scanning lines having different scanning positions with the scanning mirror 104, which will be described later. Drawing the plurality of scanning lines makes it possible to increase the resolution and/or the angle of view of the image.

The two emission ports 113-1 and 113-2 may be provided at different positions of the optical waveguide element 102, for example. For example, the two emission ports 113-1 and 113-2 may be provided side by side on one outer surface of the optical waveguide element 102.

The method of arranging the two emission ports 113-1 and 113-2 may be appropriately selected according to the purpose. The method of arrangement will be described below in "(3) Second Example of Embodiment of Present Technology (Examples of Arrangement of Emission Ports and Examples of Scanning Lines)".

The optical waveguide element 102 includes an input optical waveguide 121, a switching unit 112, and output optical waveguides 125-1 and 125-2. Furthermore, the optical waveguide element 102 may be an optical waveguide element commercially available in this technical field, or may be manufactured by a manufacturing method known in this technical field. The optical waveguide element 102 may be, for example, a quartz planar optical waveguide element.

The input optical waveguide 121 is configured to guide, to the switching unit 112, the laser beam incident from the incident port 111.

The switching unit 112 switches the emission port from which the laser beam incident from the incident port 111 is emitted. For example, the switching unit 112 switches the emission port from which the laser beam is emitted from the emission port 113-1 to the emission port 113-2, or from the emission port 113-2 to the emission port 113-1. The switching unit 112 switches the output destination of the laser beam to emit the laser beam from either the emission port 113-1 or 113-2. Switching the emission port from which the laser beam is emitted in this way makes it possible to draw the above plurality of scanning lines.

The switching unit 112 includes one Mach-Zehnder type optical switch. The optical switch may include, for example, directional couplers 122 and 124 and two arm waveguides 123-1 and 123-2 connecting these two directional couplers, as illustrated in FIG. 1A. The optical switch can switch the output optical waveguide to which the laser beam is guided to either the output optical waveguide (also called a branch waveguide) 125-1 or 125-2 according to a phase difference between the arm waveguides 123-1 and 123-2.

Figure 4:
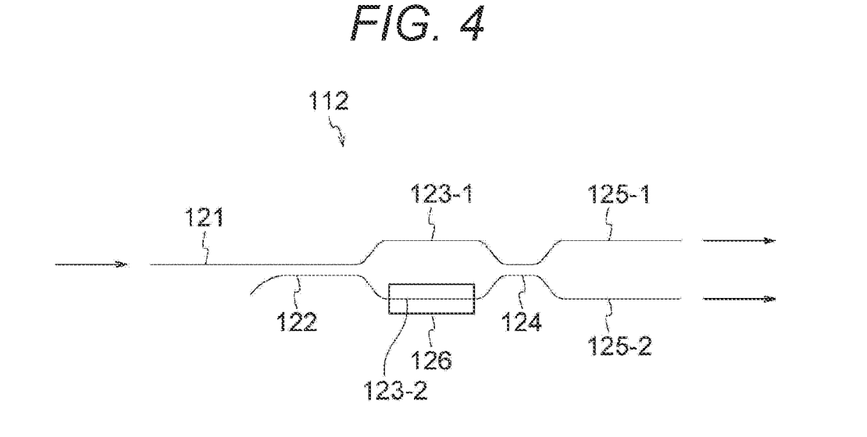
FIG. 4 is a diagram for describing a switching unit included in the optical waveguide element.

A more specific configuration example of the optical switch will be described with reference to FIG. 4. FIG. 4 illustrates the switching unit 112 as in FIG. 1A, in which the switching unit 112 includes the directional couplers 122 and 124 and the two arm waveguides 123-1 and 123-2 connecting these two directional couplers. The phase of the arm waveguide 123-2 may be controlled by a phase control unit 126. The phase control unit 126 may be, for example, a heater, particularly a thin film heater. Heating the arm waveguide 123-2 with the heater makes it possible to control the phase difference between the arm waveguide 123-1 and the arm waveguide 123-2.

The laser beam incident on the input optical waveguide 121 is separated by the directional coupler 122 in a ratio of 1:1, and light beams obtained by the separation travel to the arm waveguides 123-1 and 123-2, respectively. The light beams obtained by the separation are combined by the directional coupler 124. When the phase control unit 126 changes the phase of one of the light beams obtained by the separation, it is possible to control to which of the output optical waveguides 125-1 and 125-2 the light beam obtained by the combination by the directional coupler 124 travels. As a result, the optical switch can control the output/non-output of the laser beam from the two emission ports 113-1 and 113-2.

The phase control unit 126 may be controlled by the optical switch driver 132, for example, as illustrated in FIG. 1B. The optical switch driver 132 may switch on or off the heater included in the phase control unit 126, for example.

As the optical waveguide element including such an optical switch, a commercially available optical waveguide element may be used, or an optical waveguide element manufactured by a method known in this technical field may be used.

The emission port from which the laser beam is emitted may be switched by the switching unit 112 for every predetermined number of frames. For example, the emission port may be switched by the switching unit 112 for every frame of the projected image, for example. That is, the emission of the laser beam from the emission port 113-1 and the emission of the laser beam from the emission port 113-2 are performed for every frame. Alternatively, the emission port may be switched by the switching unit 112 for every two frames or for three or more frames.

The collimator lens 103 converts the laser beam emitted from the emission port 113-1 or 113-2 of the optical waveguide element 102 into parallel light. The emitted laser beam may be divergent light. Meanwhile, it is desirable that light projected on the retina of an eyeball 107 is the parallel light. Therefore, the collimator lens 103 converts the laser beam into the parallel light, which enables more preferable image projection.

Figure 5:
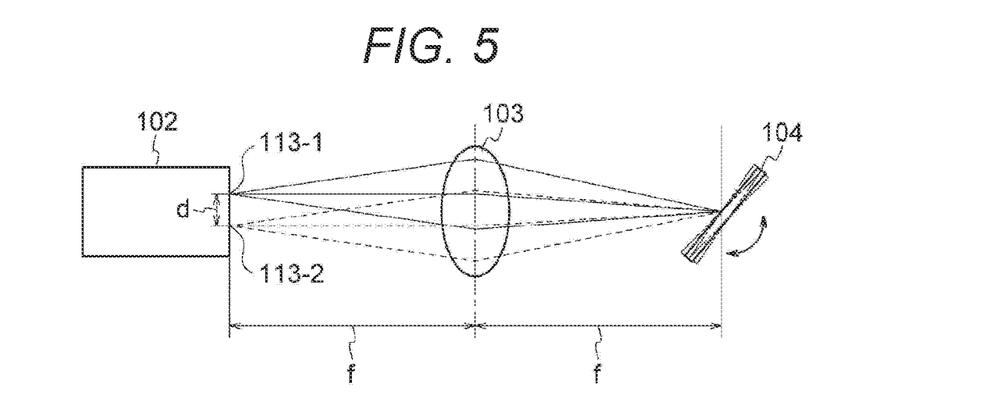
FIG. 5 is a diagram for describing a collimator lens provided on an optical path between the optical waveguide element and a scanning mirror.

An example of the arrangement of the collimator lens 103 will be described below with reference to FIG. 5. In a case where a focal length of the collimator lens 103 is f, as illustrated in FIG. 5, it is desirable that a distance from the emission ports 113-1 and 113-2 of the optical waveguide element 102 to a principal point of the collimator lens 103 and a distance from the principal point of the collimator lens 103 to the scanning mirror 104 are both f. That is, it is preferable that both of the two distances are the same as the focal length of the collimator lens 103. As described above, in the present technology, the collimator lens 103 may be arranged in a telecentric arrangement. The two distances are set as described above, so that the plurality of light beams emitted from the emission ports 113-1 and 113-2 of the optical waveguide element 102 becomes the parallel light by the collimator lens 103, and moreover, optical axes of the plurality of light beams coincide with each other on a reflecting surface of the scanning mirror 104. The reflecting surface of the scanning mirror is generally, for example, about Φ1 mm, which is very small. Therefore, if the optical axes coincide with each other as described above, it is possible to prevent the light beams from deviating from the reflecting surface of the scanning mirror 104.

The scanning mirror 104 performs scanning with the laser beams emitted from the optical waveguide element 102. By the scanning, an image (for example, a two-dimensional image) is formed from the laser beams. The scanning mirror 104 may be driven by the mirror driver 133 illustrated in FIG. 1B. A scanning cycle of the scanning mirror 104 may be synchronized with an externally input video signal.

The scanning mirror 104 may be, for example, a micro electro mechanical systems (MEMS) mirror. As the MEMS mirror, a commercially available MEMS mirror may be used, or a MEMS mirror manufactured by a method known in this technical field may be used. The MEMS mirror may generally be made by a semiconductor process microfabrication technology. The MEMS mirror performs scanning with light beams by a minute mirror of about Φ1 mm being resonated.

Furthermore, the scanning mirror 104 may be a scanning mirror that can be operated in biaxial directions, or may be a combination of two scanning mirrors each of which can perform scanning in a uniaxial direction. With this configuration, it is possible to project a two-dimensional image.

The relay lens 105 may be appropriately selected by those skilled in the art depending on the shape and/or structure of the image projection device 100. With the relay lens 105, for example, it is possible to miniaturize the optical system.

The hologram element 106 is also called a holographic optical element, for example, and condenses the laser beams with which the scanning mirror 104 performs the scanning on the vicinity of the pupil to allow the laser beams to reach the retina. The hologram element 106 may be, for example, a volume hologram element. For example, the hologram element 106 may diffract light beams having a specific wavelength and a specific angle of incidence so that the light beams are condensed on the vicinity of the pupil. The hologram element 106 may have both polarization and lens characteristics.

As illustrated in FIG. 1A, the light beams diffracted by the hologram element 106 are condensed on a vicinity 108 of the pupil of the eyeball 107 and then applied to the retina. That is, the image projection device 100 can present an image to the user with so-called Maxwellian view.

The image projection device 100 may include the control unit 130, as illustrated in FIG. 1B. The control unit 130 controls each component included in the image projection device 100 to present the image to the user. The control unit 130 may control, for example, the laser driver 131, the optical switch driver 132, and the mirror driver 133 described above. The control unit 130 may include, for example, a central processing unit (CPU) and a RAM. Any processor may be used as the CPU. The RAM includes, for example, a cache memory and a main memory, and may temporarily store programs and the like used by the CPU.

The image projection device 100 may further include, for example, various components used for the image projection, such as a disk, a communication device, and a drive. The disk may store, for example, various programs such as a program for implementing the image projection by the image projection device 100 and various image data. The communication device may acquire, for example, a program and/or image data for controlling the image projection device 100 from a network. The drive may read, for example, a program and/or image data recorded on a recording medium such as a micro SD memory card and an SD memory card and output the program and/or image data to the RAM.

The image projection device 100 may be configured as, for example, a head-mounted display (head-mounted display, hereinafter also referred to as an HMD). The head-mounted display may be, for example, a transmissive HMD or a non-transmissive HMD.

The transmissive HMD may be configured as, for example, a glasses-type display. In this case, the hologram element 106 may transmit light from the outside landscape and allow the light to reach the eyes. With the transmissive HMD, the image presented by the image projection device 100 can be superimposed on the outside landscape, and AR can be provided to the user, for example.

The non-transmissive HMD may completely cover both eyes, for example. In this case, the light from the outside landscape does not reach the eyes.

(3) Second Example of Embodiment of Present Technology (Examples of Arrangement of Emission Ports and Examples of Scanning Lines)

The optical waveguide element included in the image projection device of the present technology includes the plurality of emission ports as described above. Examples of the arrangement of the plurality of emission ports and examples of the scanning lines will be described below with reference to FIGS. 1A and 2.

An interval between the emission ports 113-1 and 113-2 of the optical waveguide element 102 illustrated in FIG. 1A may be controlled according to the image to be projected.

(3-1) Improvement of Resolution

Figure 2A:
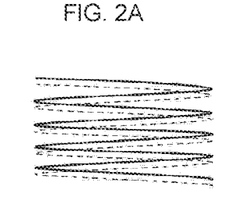
FIGS. 2A, 2B, and 2C are diagrams illustrating examples of scanning lines drawn by the image projection device according to the present technology.

In order to improve the resolution, as illustrated in FIG. 2A, between (preferably approximately in the center of) facing parts of a scanning line (solid line) drawn by the laser beam emitted from the emission port 113-1, a scanning line (broken line) drawn by the laser beam emitted from the emission port 113-2 may be arranged. With this configuration, the resolution in a vertical direction of FIG. 2A can be doubled.

For example, in order to arrange the latter scanning line approximately in the center of the facing parts of the former scanning line, in a case where a scanning line interval of the former scanning line is θ degrees, the latter scanning line is shifted from the former scanning line by (N+½) θ degrees. For example, in a case where the latter scanning line is shifted from the former scanning line by half the scanning line interval to implement the above arrangement, N is 0. Furthermore, for example, in a case where the latter scanning line is shifted from the former scanning line by 1.5 times the scanning line interval to implement the above arrangement, N is 1. As described above, "N+½" is a number for expressing how much the latter scanning line is shifted from the former scanning line. N is any integer. For example, N may be any of 0 to 10, and preferably any of 0 to 5.

As illustrated in FIG. 5, when the interval between the emission ports 113-1 and 113-2 (that is, an interval between the light emitting points) is d, the interval d for implementing the above arrangement is expressed by the following Equation 1 using the focal length f of the collimator lens 103, the number "N+½", and the scanning line interval θ.

$$d=2f\tan[(N+\tfrac{1}{2})\theta/2] \qquad \text{Equation 1}$$

For example, in a case where the scanning line interval is 0.03 degrees and f=5 mm, in order to shift the latter scanning line from the former scanning line by half, (1+½) times, or (2+½) times the interval between the facing parts of the former scanning line, the interval d is d=1.3 μm, d=3.9 μm, or d=6.5 μm, respectively, from the above equation.

Note that the above description is based on the premise that the interval between the facing parts of the former scanning line and an interval between facing parts of the latter scanning line are the same.

As described above, the interval d between the two emission ports may be set on the basis of the focal length f of the collimator lens that collimates the laser beams emitted from the optical waveguide element, the scanning line interval θ of the two scanning lines drawn by the laser beams respectively emitted from the two emission ports, and the number "N+½", which expresses how much the latter scanning line is shifted from the former scanning line.

Furthermore, in the present technology, the interval d between the two emission ports is, for example, 0.1 μm to 15 μm, preferably 0.3 μm to 10 μm, more preferably 0.5 μm to 10 μm, and even more preferably 1 μm to less than 10 μm. In the present technology, the plurality of emission ports provided in the optical waveguide element may be used as the plurality of light emitting points at such a narrow pitch. With this configuration, it is possible to emit the multi-beam at a narrow pitch, resulting in the increase in the resolution and/or the angle of view.

Furthermore, the resolution can also be tripled with three emission ports. In this case, the three emission ports are arranged in a row, and in a case where a scanning line interval of a scanning line of a laser beam emitted from a first emission port (hereinafter referred to as a "first scanning line") is θ degrees, a scanning line of a laser beam emitted from a second emission port (hereinafter referred to as a "second scanning line") may be shifted from the first scanning line by (N+⅓) θ degrees, and a scanning line of a laser beam emitted from a third emission port (hereinafter, a "third scanning line") may be shifted from the first scanning line by (M+⅔) θ degrees. That is, these three scanning lines are arranged so that the scanning line interval of the first scanning line is divided into three equal parts by the second scanning line and the third scanning line. For example, in a case where the three scanning lines are arranged at intervals so as to be shifted by (N+⅓) θ degrees, the third scanning line may be shifted by (2N+⅔) θ degrees. Here, each of "N+⅓" and "M+⅔" is a number for expressing how much the second scanning line or the third scanning line is shifted from the first scanning line, as in the case of the two emission ports described above. N and M are any integers and may be the same or different. N and M may be, for example, any of 0 to 10, and preferably any of 0 to 5.

When an interval between the first emission port and the second emission port is $d_1$ and an interval between the second emission port and the third emission port is $d_2$, in order to implement this arrangement, the intervals $d_1$ and $d_2$ are expressed by the following Equation 2 using the focal length f of the collimator lens, the number "N+⅓", and the scanning line interval θ.

$$d_1 = d_2 = f \tan[(N+⅓)\theta] \quad \text{Equation 2}$$

As described above, in the present technology, the plurality of emission ports may be arranged so that, between facing parts of a scanning line of a laser beam emitted from one emission port, a scanning line of a laser beam emitted from another emission port is arranged. The interval between the plurality of emission ports may be set on the basis of the focal length of the collimator lens that collimates the laser beams emitted from the optical waveguide element, the scanning line interval of the plurality of scanning lines drawn by the laser beams emitted respectively from the plurality of emission ports, and how much the plurality of scanning lines is shifted from each other. Here, the focal length and the scanning line interval are often default values. In this case, in order to improve the resolution according to the present technology, the interval between the plurality of emission ports may be set on the basis of how much the plurality of scanning lines is shifted from each other. That is, the interval between the plurality of emission ports may correspond to how much the plurality of scanning lines is shifted from each other.

(3-2) Increase in Angle of View

Figure 2B:
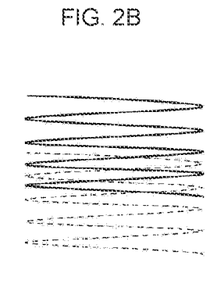
Figure 2C:
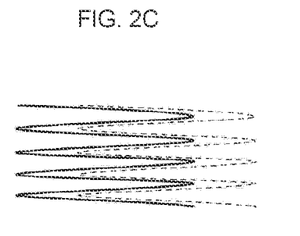

In order to increase the angle of view, for example, as illustrated in FIGS. 2B and 2C, an area of the scanning line (solid line) drawn by the laser beam emitted from the emission port 113-1 (also referred to as a "scanning range") and an area of the scanning line (broken line) drawn by the laser beam emitted from the emission port 113-2 may be arranged so as to be shifted from each other. FIG. 2B is an example of the arrangement of the scanning lines in a case where the angle of view is increased in a slow axis direction. FIG. 2C is an example of the arrangement of the scanning lines in a case where the angle of view is increased in a fast axis direction. In this way, the angle of view can be increased by the area of one scanning line being shifted from the area of the other scanning line.

In a case where the amount of increase in the angle of view is Φ degrees, the interval d between the emission ports 113-1 and 113-2 (that is, the interval between the light emitting points) is expressed by the following Equation 3.

$$d = 2f \tan[\Phi/2] \quad \text{Equation 3}$$

Here, f is the focal length of the collimator lens 103.

For example, in order to increase the angle of view by 10 degrees, the interval d may be set to about 0.9 mm in a case of f=5 mm.

As described above, in the present technology, the plurality of emission ports may be arranged so that a scanning range of a laser beam emitted from one emission port and a scanning range of a laser beam emitted from another emission port are shifted from each other. The interval between the plurality of emission ports may be set on the basis of the focal length of the collimator lens that collimates the laser beams emitted from the optical waveguide element and the amount of increase in the angle of view. Here, the focal length is often a default value. Therefore, in order to increase the angle of view according to the present technology, the interval between the plurality of emission ports may be set on the basis of the amount of increase in the angle of view. That is, the interval between the plurality of emission ports may correspond to the amount of increase in the angle of view.

(3-3) Example of Optical Waveguide Element Including Three or More Emission Ports In the present technology, the optical waveguide element may include three or more emission ports. All of the three or more emission ports may be used for improving the resolution, all of the three or more emission ports may be used for improving the angle of view, or the three or more emission ports may be used for both improving the resolution and increasing the angle of view.

An example of the optical waveguide element including the three or more emission ports will be described below with reference to FIGS. 3A and 3B.

(3-3-1) Example of Optical Waveguide Element Including Three Emission Ports

Figure 3A:
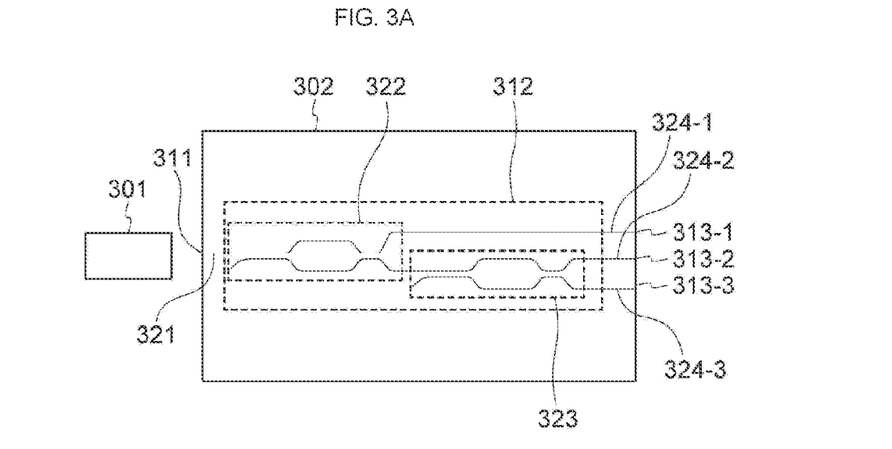
FIG. 3A is a diagram illustrating an example of an optical waveguide element included in the image projection device according to the present technology.

An optical waveguide element 302 illustrated in FIG. 3A includes one incident port 311 on which a laser beam emitted from a laser light source 301 is incident, three emission ports 313-1, 313-2, and 313-3 from which the laser beam is emitted. In the present technology, such an optical waveguide element including three emission ports may be used. For example, all of the three emission ports may be used for improving the resolution, all of the three emission ports may be used for improving the angle of view, or a part of the three emission ports may be used for improving the resolution and the rest may be used for improving the angle of view.

The three emission ports 313-1, 313-2, and 313-3 may be provided at different positions of the optical waveguide element 302, for example. For example, the three emission ports may be provided side by side on one outer surface of the optical waveguide element 302.

The method of arranging the three emission ports may be appropriately selected according to the purpose. For example, the three emission ports may be arranged at the intervals as described in (3-1) above.

The optical waveguide element 302 includes an input optical waveguide 321, a switching unit 312, and output optical waveguides 324-1, 324-2, and 324-3.

The input optical waveguide 321 is configured to guide, to the switching unit 312, the laser beam incident from the incident port 311.

The switching unit 312 switches the emission port from which the laser beam incident from the incident port 311 is emitted. For example, the switching unit 312 switches the emission port from which the laser beam is emitted from the emission port 313-1 to any of the other emission ports, from the emission port 313-2 to any of the other emission ports, or from the emission port 313-3 to any of the other emission ports. The switching unit 312 switches the output destination of the laser beam to emit the laser beam from any of the three emission ports. Switching the emission port from which the laser beam is emitted in this way makes it possible to draw the above plurality of scanning lines.

The switching unit 312 includes two Mach-Zehnder type optical switches 322 and 323. The optical switches 322 and 323 may be the same as the optical switch described above with reference to FIGS. 1A, 1B, and 4. Controlling these two optical switches 322 and 323 makes it possible to switch the emission port from which the laser beam is emitted.

(3-3-2) Example of Optical Waveguide Element Including Four Emission Ports

Figure 3B:
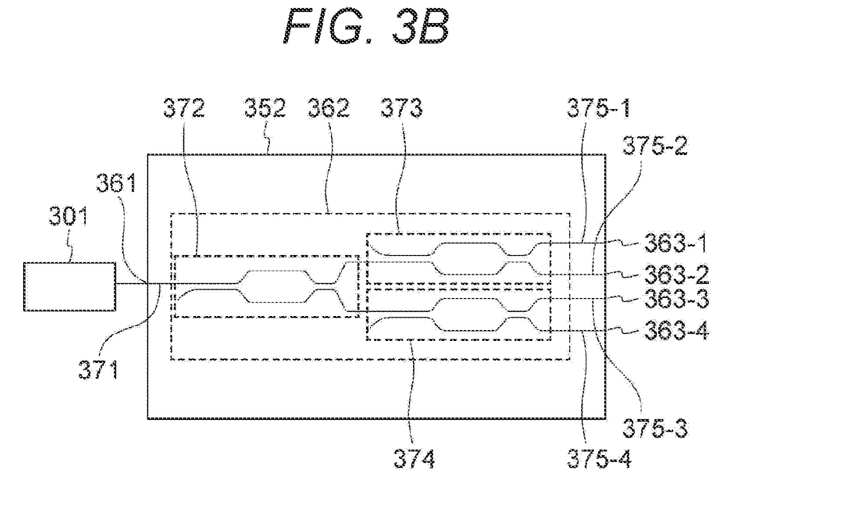
FIG. 3B is a diagram illustrating an example of the optical waveguide element included in the image projection device according to the present technology.

An optical waveguide element 352 illustrated in FIG. 3B includes one incident port 361 on which a laser beam emitted from the laser light source 301 is incident and four emission ports 363-1, 363-2, 363-3, and 363-4 from which the laser beam is emitted. In the present technology, such an optical waveguide element including four emission ports may be used. For example, all of the four emission ports may be used for improving the resolution or increasing the angle of view, or the four emission ports may be used for improving the resolution and increasing the angle of view.

The four emission ports 363-1, 363-2, 363-3, and 363-4 may be provided at different positions of the optical waveguide element 352, for example. The method of arranging the four emission ports may be appropriately selected according to the purpose.

For example, as illustrated in FIG. 3B, the four emission ports may be provided side by side on one outer surface of the optical waveguide element 352.

All of the four emission ports may be used for improving the resolution as described in (3-1) above. For example, in one scanning line interval of a scanning line drawn by a laser beam emitted from one of the four emission ports, all of scanning lines drawn by laser beams emitted from the other three emission ports may be arranged.

Alternatively, for example, the resolution may be improved by each of a set of the emission ports 363-1 and 363-2 and a set of the emission ports 363-3 and 363-4, and the angle of view may be increased by the two sets.

Alternatively, the four emission ports may be arranged so as to form four corners of a rectangle (square or rectangle). For example, the four emission ports are divided into two sets of two, and two emission ports constituting each of the two sets are arranged at the interval as described in (3-1) above. With this configuration, the resolution is improved. Furthermore, one set and the other set may be arranged at the interval as described in (3-2) above. For example, the emission ports 363-3 and 363-4 illustrated in FIG. 3B may be arranged on the back side or the front side of the paper surface with respect to the emission ports 363-1 and 363-2, respectively. With this configuration, the angle of view is increased. In this way, it is possible to improve the resolution and increase the angle of view.

The optical waveguide element 352 includes an input optical waveguide 371, a switching unit 362, and output optical waveguides 375-1, 375-2, 375-3, and 375-4.

The input optical waveguide 371 is configured to guide, to the switching unit 362, the laser beam incident from the incident port 361.

The switching unit 362 switches the emission port from which the laser beam incident from the incident port 361 is emitted. For example, the switching unit 362 switches the emission port from which the laser beam is emitted from the emission port 363-1 to any of the other emission ports, from the emission port 363-2 to any of the other emission ports, from the emission port 363-3 to any of the other emission ports, or from the emission port 363-4 to any of the other emission ports. The switching unit 362 switches the output destination of the laser beam to emit the laser beam from any of the 34 emission ports. Switching the emission port from which the laser beam is emitted in this way makes it possible to draw the above plurality of scanning lines.

The switching unit 362 includes three Mach-Zehnder type optical switches 372, 373, and 374. The three optical switches may be the same as the optical switch described above with reference to FIGS. 1A, 1B, and 4. Controlling these three optical switches makes it possible to switch the emission port from which the laser beam is emitted.

(3-4) Example of Configuration with Plurality of Laser Light Sources

The image projection device according to the present technology may include a plurality of laser light sources. The number of laser light sources included in the image projection device according to the present technology is, for example, two to five, and preferably two to four, and particularly may be two to four. A configuration example of a portion of the laser light sources and the optical waveguide element in the image projection device including the plurality of laser light sources will be described below with reference to FIGS. 6A, 6B, and 6C.

Figure 6A:
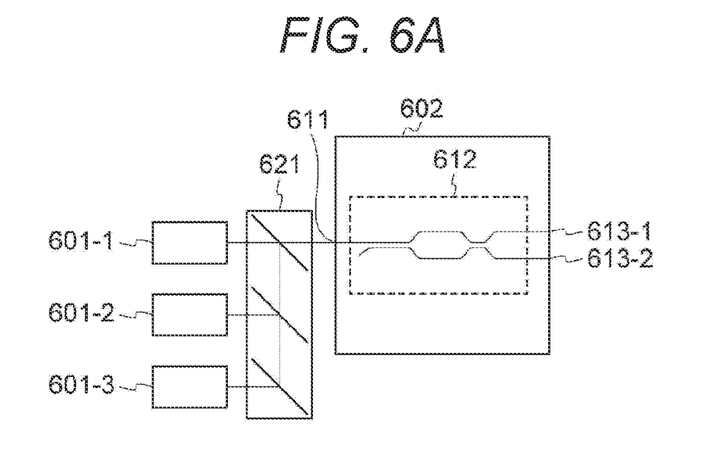
FIG. 6A is a diagram illustrating a configuration example of laser light sources and the optical waveguide element.

(3-4-1) Example of Configuration in which Plurality of Laser Beams is Combined and Incident on Incident Light FIG. 6A illustrates an example in which three laser light sources 601-1, 601-2, and 601-3 are connected to an optical waveguide element 602. The laser light sources 601-1, 601-2, and 601-3 may be laser light sources of red, blue, and green colored light, respectively. Three laser beams emitted from these laser light sources are combined by a combining unit 621. The combining unit 621 may include, for example, a dichroic mirror and/or a polarizing beam splitter. The configuration of the component (for example, the dichroic mirror and/or the polarizing beam splitter) included in the combining unit 621 may be appropriately set according to, for example, the arrangement of the laser light sources, the position of an incident port, and the like. The three laser beams are combined by the combining unit 621, and the laser beam obtained by the combination is then incident on an incident port 611 of the optical waveguide element 602. The laser beam incident from the incident port 611 travels to a switching unit 612. Since the configuration of the switching unit 612 is the same as that of the switching unit 112 described above with reference to FIG. 1A, the description thereof will be omitted. The switching unit 612 switches from which of emission ports 633-1 and 633-2 the laser beam is emitted.

As described above, the image projection device of the present technology may include the plurality of laser light sources and the combining unit that combines the plurality of laser beams emitted from the plurality of laser light sources. The laser beam obtained by the combination by the combining unit may be incident on the incident light of the optical waveguide element.

Figure 6B:
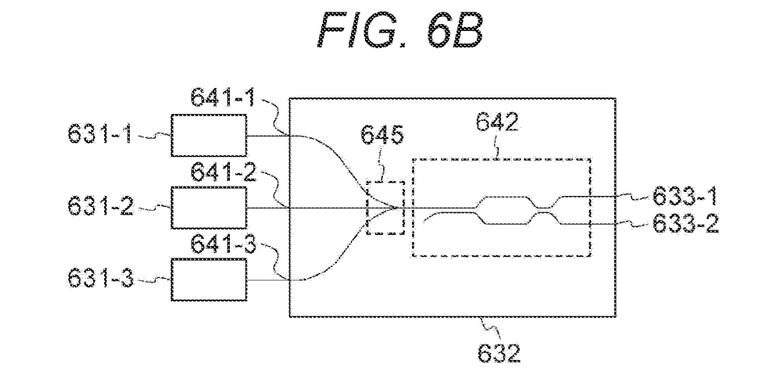
FIG. 6B is a diagram illustrating a configuration example of the laser light sources and the optical waveguide element.

(3-4-2) Example of Configuration in which Plurality of Laser Beams is Combined in Optical Waveguide Element FIG. 6B illustrates an example in which three laser light sources 631-1, 631-2, and 631-3 are connected to an optical waveguide element 632. The laser light sources 631-1, 631-2, and 631-3 may be laser light sources of red, blue, and green colored light, respectively. Three laser beams emitted from the laser light sources 631-1, 631-2, and 631-3 are incident on three incident ports 641-1, 641-2, and 641-3 of the optical waveguide element 632, respectively. The laser beams incident from the incident ports 641-1, 641-2, and 641-3 are combined by a combining unit 645 in the optical waveguide element 632. The laser beam obtained by the combination then travels to a switching unit 642. Since the switching unit 642 is the same as the switching unit 112 described with reference to FIG. 1A, the description thereof will be omitted. The switching unit 642 switches from which of the emission ports 633-1 and 633-2 the laser beam is emitted.

As described above, the image projection device of the present technology may include the plurality of laser light sources and the optical waveguide element including the plurality of incident ports. The optical waveguide element may include the combining unit that combines the laser beams incident from the plurality of incident ports. The laser beam obtained by the combination by the combining unit travels to the switching unit in the optical waveguide element. A waveguide constituting the combining unit may be appropriately designed by those skilled in the art.

The combining unit is provided in the optical waveguide element, so that the switching unit and the combining unit are integrated in the optical waveguide element. With this configuration, the device can be miniaturized. Furthermore, since the plurality of laser beams is emitted from one emission port, it is possible to eliminate color shift.

Figure 6C:
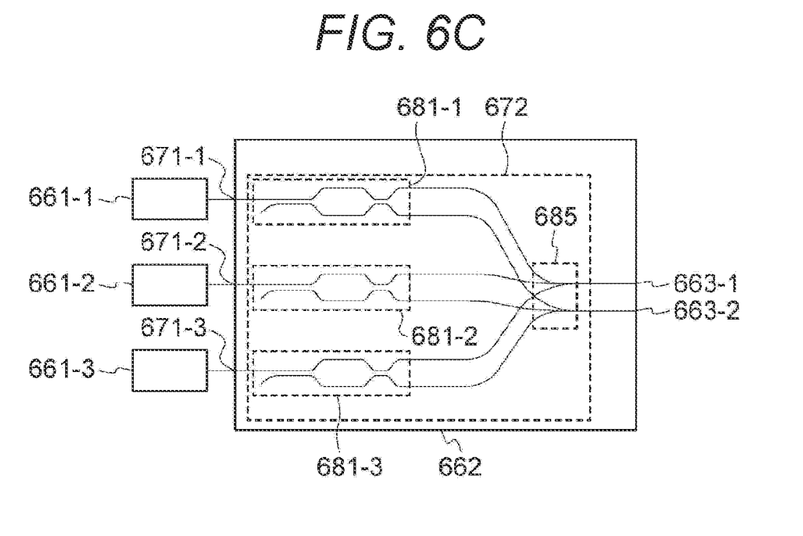
FIG. 6C is a diagram illustrating a configuration example of the laser light sources and the optical waveguide element.

(3-4-3) Another Example of Configuration in which Plurality of Laser Beams is Combined in Optical Waveguide Element FIG. 6C illustrates an example in which three laser light sources 661-1, 661-2, and 661-3 are connected to an optical waveguide element 662. The laser light sources 661-1, 661-2, and 661-3 may be laser light sources of red, blue, and green colored light, respectively. Three laser beams emitted from the laser light sources 661-1, 661-2, and 661-3 are incident on three incident ports 671-1, 671-2, and 671-3 of the optical waveguide element 662, respectively. The laser beams incident from the incident ports 671-1, 671-2, and 671-3 each travel to a switching unit 672 in the optical waveguide element 662. The switching unit 672 includes three optical switches 681-1, 681-2, and 681-3. The laser beams incident from the incident ports 671-1, 671-2, and 671-3 travel to the optical switches 681-1, 681-2, and 681-3, respectively. These optical switches each switch from which of emission ports 663-1 and 663-2 the laser beam is emitted. Furthermore, the optical waveguide element 662 includes a combining unit 685 that combines the laser beams having passed through these optical switches. For example, in the combining unit 685, all of the above three laser beams may be combined, and then, the laser beam obtained by the combination may be emitted from either the emission port 663-1 or 663-2. Alternatively, two of the above three laser beams may be combined, then, the laser beam obtained by the combination may be emitted from the emission port 663-1 (or 663-2), and the remaining one laser beam may be emitted from the emission port 663-2 (or 663-1).

As described above, the image projection device of the present technology may include the plurality of laser light sources and the optical waveguide element including the plurality of incident ports. The switching unit included in the optical waveguide element includes the plurality of optical switches, and the plurality of optical switches may be connected to the plurality of incident ports, respectively. The plurality of optical switches each switches the emission port from which the corresponding laser beam is emitted.

With this configuration, a plurality of lines of the input video signal can be modulated by the laser light sources and the optical switches and output at the same time. Therefore, it is possible to seamlessly achieve a higher resolution without switching the image for each frame.

(4) Third Example of Embodiment of Present Technology (Example of Image Projection Device)

According to another embodiment of the present technology, the image projection device may allow the laser beam with which the scanning mirror performs the scanning to reach the projection surface without or through the projection optical system. The image projection device may be configured as, for example, a small projector (also called a pico projector).

An example of the image projection device according to this embodiment will be described below with reference to FIG. 7.

Figure 7:
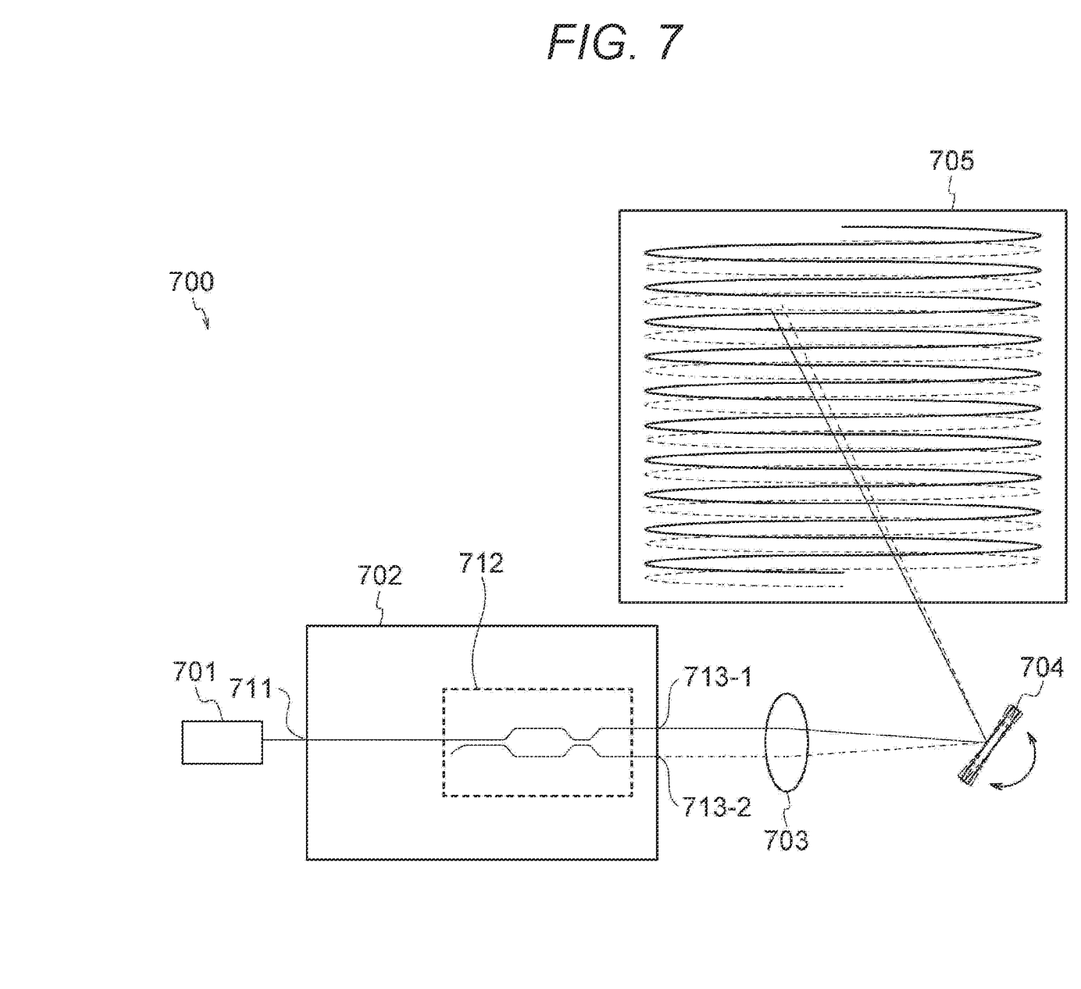
FIG. 7 is a schematic diagram of a configuration example of the image projection device according to the present technology.

FIG. 7 illustrates a configuration example of an image projection device 700 according to the present technology. The image projection device 700 includes a laser light source 701, an optical waveguide element 702, a collimator lens 703, and a scanning mirror 704. The optical waveguide element 702, an incident port 711 on which a laser beam emitted from the laser light source 701 is incident, a switching unit 712, and emission ports 713-1 and 713-2 from which the laser beam is emitted are provided. The laser light source 701, the optical waveguide element 702, the collimator lens 703, and the scanning mirror 704 may be the same as the laser light source 101, the optical waveguide element 102, the collimator lens 103, and the scanning mirror 104 described above with reference to FIG. 1A, respectively, and the above description also applies to these components. Therefore, the description of these components will be omitted.

Furthermore, the image projection device 700 may include the control unit 130, the laser driver 13, the optical switch driver 132, and the mirror driver 133, which have described above with reference to FIG. 1B.

The scanning mirror 704 performs scanning with the laser beam emitted from the optical waveguide element 702. By the scanning, an image (for example, a two-dimensional image) is formed from the laser beams. The laser beam with which the scanning mirror 704 performs the scanning reaches any projection surface 705, and the image is displayed on the projection surface 705.

The image projection device 700 may be configured as a small projector, for example, a projector having such a size that the projector fits in a palm of a human. The small projector having this size is also called a pico projector.

The image projection device 700 does not have to include the collimator lens 703, but it is more preferable to include the collimator lens 703.

The image projection device 700 may allow the laser beam with which the scanning mirror 704 performs the scanning to reach the projection surface 705 without the projection optical system, or to reach the projection surface 705 through the projection optical system. That is, the image projection device 700 does not have to be provided with the projection optical system on an optical path between the scanning mirror 704 and the projection surface 705, or may be provided with the projection optical system on the optical path. The projection optical system may be used, for example, to enlarge or reduce the image formed by the scanning mirror 704. The projection optical system may include, for example, one or more lenses and the like. The configuration of the projection optical system may be appropriately selected according to a desired image projection method.

The description described in above "(2) First Example of Embodiment of Present Technology (Example of Image Projection Device)" and "(3) Second Example of Embodiment of Present Technology (Examples of Arrangement of Emission Ports and Examples of Scanning Lines)" also applies to the present embodiment. As described in the description, the image projection device 700 has similar effects as the image projection device 100, such as enabling the increase in the resolution and/or the angle of view beyond the performance of the scanning mirror, for example.

Note that the present technology may have the following configurations.

[1] An image projection device including
an optical waveguide element including at least one incident port on which a laser beam is incident and a plurality of emission ports from which the laser beam is emitted, and
a scanning mirror that performs scanning with the laser beam emitted from the optical waveguide element, in which
the laser beam with which the scanning mirror performs the scanning reaches a projection target.
[2] The image projection device according to [1], in which the optical waveguide element includes a switching unit that switches an emission port from which the laser beam is emitted.
[3] The image projection device according to [1], in which the optical waveguide element includes a switching unit that switches an emission port from which the laser beam is emitted, and the switching unit includes at least one optical switch.
[4] The image projection device according to [1], in which the optical waveguide element includes a switching unit that switches an emission port from which the laser beam is emitted, and the switching unit includes at least one Mach-Zehnder type optical switch.
[5] The image projection device according to any one of [1] to [4], in which a scanning line of a laser beam emitted from at least one of the plurality of emission port is shifted from a scanning line of a laser beam emitted from another emission port.
[6] The image projection device according to any one of [1] to [5], in which the plurality of emission ports is arranged so that, between facing parts of a scanning line of a laser beam emitted from one emission port, a scanning line of a laser beam emitted from another emission port is arranged.
[7] The image projection device according to [6], in which the one emission port and the another emission port are arranged so that a line connecting the one emission port and the another emission port is perpendicular to a sweep direction of the scanning mirror.
[8] The image projection device according to any one of [1] to [7], in which the plurality of emission ports is arranged so that a scanning range of a laser beam emitted from one emission port and a scanning range of a laser beam emitted from another emission port are shifted from each other.
[9] The image projection device according to any one of [1] to [8], in which an emission port from which the laser beam is emitted is switched for every predetermined number of frames.
[10] The image projection device according to any one of [1] to [9], in which a collimator lens that collimates the emitted laser beam is arranged on an optical path between the optical waveguide element and the scanning mirror.
[11] The image projection device according to any one of [1] to [10], further including a hologram element that condenses the laser beam with which the scanning mirror performs the scanning on a vicinity of a pupil to allow the laser beam to reach a retina.
[12] The image projection device according to any one of [1] to [10], in which the laser beam with which the scanning mirror performs the scanning reaches a projection surface without or through a projection optical system.

REFERENCE SIGNS LIST

100 Image projection device
101 Laser light source
102 Optical waveguide element
103 Collimator lens
104 Scanning mirror
105 Relay lens
106 Hologram element

The invention claimed is:

1. An image projection device, comprising:
an optical waveguide element including:
at least one incident port on which a laser beam is incident; and
a plurality of emission ports from which the laser beam is emitted;
a scanning mirror configured to perform scanning operation with the laser beam emitted from the optical waveguide element; and
a switching unit configured to switch at least one emission port, of the plurality of emission ports, from which the laser beam is emitted, wherein
the laser beam that reaches the switching unit is a combined laser beam in which a plurality of laser beams is combined,
a scanning line of the laser beam emitted from the at least one emission port of the plurality of emission ports is shifted from a scanning line of a laser beam emitted from another emission port, and
the laser beam with which the scanning mirror performs the scanning operation reaches a projection target.

2. The image projection device according to claim 1, wherein the switching unit includes at least one optical switch.

3. The image projection device according to claim 1, wherein the switching unit includes at least one Mach-Zehnder type optical switch.

4. The image projection device according to claim 1, wherein an arrangement of the plurality of emission ports is such that a scanning line of a laser beam emitted from a first emission port of the plurality of emission ports is between facing parts of a scanning line of a laser beam emitted from a second emission port of the plurality of emission ports.

5. The image projection device according to claim 4, wherein the second emission port and the first emission port are such that a line connecting the second emission port and the first emission port is perpendicular to a scanning direction of the scanning mirror.

6. The image projection device according to claim 1, wherein an arrangement of the plurality of emission ports is such that a scanning range of a laser beam emitted from a first emission port of the plurality of emission ports is shifted from a scanning range of a laser beam emitted from a second emission port of the plurality of emission ports.

7. The image projection device according to claim 1, wherein the at least one emission port from which the laser beam is emitted is switched for every specific number of frames.

8. The image projection device according to claim 1, wherein a collimator lens that collimates the emitted laser beam is on an optical path between the optical waveguide element and the scanning mirror.

9. The image projection device according to claim 1, further comprising a hologram element configured to condense the laser beam with which the scanning mirror performs the scanning operation, on a vicinity of a pupil to allow the laser beam to reach a retina.

10. The image projection device according to claim 1, wherein the laser beam with which the scanning mirror performs the scanning operation reaches a projection surface without or through a projection optical system.

* * * * *